(12) United States Patent
Sandquist

(10) Patent No.: US 7,368,992 B2
(45) Date of Patent: May 6, 2008

(54) LOAD-INVARIANT AMPLIFIER

(75) Inventor: Peter Sandquist, Kavlevägen 119, Huddinge (SE) SE-141 59

(73) Assignee: Peter Sandquist, Huddinge (SE)

( * ) Notice: Subject to any disclaimer, the term of this patent is extended or adjusted under 35 U.S.C. 154(b) by 98 days.

(21) Appl. No.: 10/597,700

(22) PCT Filed: Feb. 15, 2005

(86) PCT No.: PCT/SE2005/000197

§ 371 (c)(1),
(2), (4) Date: Aug. 4, 2006

(87) PCT Pub. No.: WO2005/078918

PCT Pub. Date: Aug. 25, 2005

(65) Prior Publication Data

US 2007/0164821 A1    Jul. 19, 2007

(30) Foreign Application Priority Data

Feb. 18, 2004   (SE) ................................ 0400374

(51) Int. Cl.
*H03F 3/18* (2006.01)
(52) U.S. Cl. .................. 330/264; 330/265; 330/268; 330/274
(58) Field of Classification Search ........... 330/264, 330/265, 268, 274
See application file for complete search history.

(56) References Cited

U.S. PATENT DOCUMENTS

| | | | |
|---|---|---|---|
| 3,852,678 A | 12/1974 | Frye | |
| RE29,273 E * | 6/1977 | Reiffin | 381/121 |
| 4,728,903 A * | 3/1988 | Reiffin | 330/264 |
| 4,866,398 A * | 9/1989 | Gulczynski | 330/263 |
| 5,361,041 A | 11/1994 | Lish | |
| 5,512,857 A * | 4/1996 | Koskowich | 330/252 |
| 6,414,549 B1 * | 7/2002 | Barbetta | 330/264 |

FOREIGN PATENT DOCUMENTS

EP    0684698    11/1995

* cited by examiner

Primary Examiner—Patricia Nguyen
(74) Attorney, Agent, or Firm—Albihns AB

(57) ABSTRACT

A push-pull amplifier having low output impedance and low crossover distortion is provided. A least one of a current through a sourcing current path of an output stage and a current through a sinking current path of the output stage is determinative of a quiescent current control signal produced for controlling a quiescent current of the amplifier. The quiescent current is controlled by symmetrically controlling a bias voltage applied to a sourcing active output device and a bias voltage applied to a sinking active output device in response to the quiescent current control signal. An output stage sourcing control signal for controlling the sourcing active output device is referenced directly to a shared terminal of the sourcing active output device, and an output stage sinking control signal for controlling the sinking active output device is referenced directly to a shared terminal of the sinking active output device.

6 Claims, 5 Drawing Sheets

LOAD-INVARIANT AMPLIFIER

TECHNICAL AREA

The present invention relates to electronic amplification. More specifically, the invention relates to biasing of linear push-pull power amplifiers.

BACKGROUND ART

Electronic amplifiers have found their way into applications such as e.g. audio reproduction. Audio may be represented by a low-level electrical signal. In the process of transforming such a signal into sounds perceivable by the human ear, it is amplified in terms of voltage and/or current and forwarded to an electromechanical transducer, i.e. a loudspeaker. Electrical amplification is accomplished by using a so-called power amplifier.

The vast majority of power amplifiers today for linear applications such as audio reproduction are push-pull amplifiers. Such amplifiers employ disparate first and second circuitry for sourcing and sinking current respectively to a load such as a loudspeaker. Henceforth, the first circuitry will be referred to as sourcing circuitry, and the second circuitry will be referred to as sinking circuitry. Their constituent parts will be denoted correspondingly.

The sourcing circuitry thus sources current and therefore is connected to a positive voltage supply terminal of a power supply, while the sinking circuitry sinks current and therefore is connected to a negative voltage supply terminal of the power supply. Each of the sourcing and sinking circuitry has one or several power handling output devices connected serially or in parallel.

Active power output devices, i.e. valves or power transistors are inherently non-linear, particularly when currents are low. In push-pull amplifiers, this causes crossover distortion. Crossover occurs when load current switches direction, i.e. when handling of load current switches from one or a set of sourcing output devices to one or a set of sinking output devices or vice versa.

A means to lower the impact of non-linearity inherent in active output devices, and subsequently to lower crossover distortion, is to traverse a quiescent current through the sourcing and sinking output devices. By properly drawing a quiescent current through the output devices, they are forced to operate in a more linear region when load current is low. This is called biasing. Amplifiers that operate in this way are traditionally said to operate in class A or class AB.

Traditional class A amplifiers are biased to provide through-conduction of quiescent current at all times while the amplifier is in operation, for all permissible loads. A drawback is that the quiescent current often becomes very large, with resulting large internal power dissipation. In traditional class AB amplifiers, the quiescent current is much lower but load currents above some generally quite low level force the active output devices that do not carry the load current at any given point in time to cut off, thereby causing some crossover distortion.

In the art, it is known to prevent cut off while keeping the quiescent current in the same order of magnitude as for a traditional class AB amplifier, thus overcoming traditional class A amplifier shortcomings without introducing significant crossover distortion.

In some applications it is important that power amplifiers have very low output impedance. For example, designers of high performance loudspeakers generally model power amplifiers as perfect or near perfect voltage sources. Thus, the output of a model power amplifier substantially maintains a voltage proportional to the input signal, irrespective of impedance variations caused by reactive components of the loudspeaker. This means that parts that together constitute a loudspeaker, i.e. cabinets, speaker elements, ports, crossover filters and so fourth are designed to produce a desired sound when a power amplifier connected to the loudspeaker has low output impedance. Accordingly, power amplifiers suitable for high performance loudspeakers generally have low output impedance. Achieving low output impedance is however by no means trivial, or has substantial drawbacks.

Global negative feedback is often employed in power amplifiers. Global negative feedback lowers the output impedance. The impedance reduction that can be achieved through global negative feedback is however dependent on the amount of feedback that can be applied. A certain amount of global negative feedback usually has its merits and is often even quite necessary, but extensive negative feedback compromises stability. If loop gain, being the product of forward and feedback gain is too high with respect to available bandwidths and other stability criteria, distortion increases and self-oscillation may even be induced.

Paralleling of power handling output devices also brings down output impedance. Depending on design and types of output devices, paralleling may cause various well-known implications such as difficulties in achieving appropriate current sharing between the paralleled output devices.

In solid-state amplifiers, so-called degeneration resistors, also known as emitter or source resistors, are often fitted in the amplifier's output stage, at the amplifier's power handling transistors. This is particularly so in discrete designs where current sensing can not easily be carried out on the active output devices because of process variations, thermal variations and difficulties in achieving thermal proximity with other components. Current sensing is generally required for efficiently controlling the quiescent current.

Reduced impedance degeneration resistors lower the output impedance of the amplifier. Biasing however generally becomes more difficult, since control of quiescent current becomes more critical.

Low output impedance can also be accomplished by employing local positive feedback, though stability and biasing may be detrimentally affected.

Some applications require Direct-Current (DC) amplification. Such a requirement rules out amplifier designs that implicitly carry out high-pass filtering or designs that otherwise degrade signals that have a DC offset voltage.

In some applications, including quality audio reproduction, measures are sometimes taken to eliminate or reduce unwanted DC voltages being present at the output of intrinsically DC coupled amplifiers. Even so, internal DC amplification is often advantageous since control of low-frequency response can be simplified and made more precise e.g. through DC servo arrangements that provide low frequency negative feedback. Conversely, lack of ability to amplify DC signals may be disadvantageous.

Examples from the prior art pertinent to output impedance and/or biasing are shown below.

In U.S. Pat. No. 5,389,894, Ryat discloses a power amplifier comprising an input amplifier gain stage, a bias circuit for enabling class AB operation and a sourcing and a sinking output transistor in a push-pull output stage. The gain stage supplies a signal drive current only to the sourcing output transistor, while the sinking output transistor receives its drive current from the bias circuit. Thus, the signal drive current from the gain stage to the sourcing transistor is separate from the drive current from the bias circuit to the sinking transistor. The object is to provide high drive capability, high voltage swing, and an amplifier that does not suffer from high output impedance under high current conditions.

The power amplifier disclosed by Ryat employs design principles that presuppose close thermal coupling and closely matched components. Such an environment is generally found in monolithic integrated circuits. Discrete designs on the other hand generally have to cope with significant parameter spreads due to differing reciprocal temperatures and process variations.

For example, to sense currents through the output transistors, Ryat uses second transistors that share $V_{be}$-voltages with the output transistors, for generating second currents proportional to the currents through the output transistors. Thus, current sensing is carried out on the output transistors. As previously said, this is not easily done in discrete designs, particularly with some types of output devices such as MOSFETs where process and temperature variations have gross impact on the electrical properties.

Moreover, the bias control and the output transistor drive circuitry are asymmetric. Asymmetry is generally known to cause problems, e.g. distortion, DC voltage operating point offset or drift with changing temperature.

In U.S. Pat. No. 5,055,797, Chater discloses a push-pull power amplifier having automatic bias control. Output currents from sourcing and sinking output transistors of the output stage of the amplifier are determined by sensing voltages across sourcing and sinking sensing resistors, the sensed voltages being proportional to the output currents. The sensed voltages are added and the resulting sum signal is operated upon for extracting a signal proportional to a peak minimum value. The signal being proportional to the peak minimum value is used in a negative feedback loop for controlling the quiescent current of the amplifier. The object is to provide a method of bias control that is not dependent on thermal variations of the output transistors, is unaffected by the presence or absence of an output signal, and that accordingly reduces crossover distortion.

The biasing scheme of Chater has little effect on output impedance. Furthermore, the amplifier is not DC coupled. If it were, it would be insufficiently biased for DC signals since the peak minimum value would not unconditionally represent the quiescent current in the presence of a load current.

In U.S. Pat. No. 4,439,743, a biasing circuit is shown for reducing distortion in power amplifiers caused by non-linear amplifying elements. This is accomplished by excluding output transistors in the signal transmission path of the biasing circuit.

In U.S. Pat. No. 4,489,283 there is disclosed a power amplifier having a fixed and a variable biasing circuit. The variable biasing circuit enables full cycle conduction of power-amplifying elements. This is achieved by sensing control voltages ($V_{be}$) of the power amplifying elements and in response thereto providing calibration currents used for controlling the power amplifying elements in such a way as to prevent cut-off during a full signal cycle.

In U.S. Pat. No. 5,977,829, an amplifier having a variable quiescent current is shown. At low output power levels, a biasing circuit provides a reduced biasing current to the input stage of the amplifier, while at higher output power levels the biasing current is augmented in order to reduce distortion.

In U.S. Pat. No. 6,188,269 there is disclosed a rail-to-rail amplifier having a bias-current that is substantially independent of process variations, temperature and supply voltage. A sub circuit mimics an idle output stage. A bias voltage is generated in response to a current through the sub circuit. The bias voltage in turn controls the quiescent current through an output stage.

In U.S. Pat. No. 4,558,288 there is disclosed an emitter-follower type push-pull output stage in which a bias circuit prevents cut-off of output transistors, thereby decreasing crossover distortion.

In U.S. Pat. No. 4,885,674 there is disclosed a load-independent switch-mode power converter. The invention features a positive current-feedback loop that compensates for varying voltage drops caused by load variations.

In the prior art there are thus known various biasing schemes and methods to lower output impedance of an amplifier and to prevent cut-off. However, there is yet room for substantial improvement.

A problem in the art is to devise a push-pull amplifier that has a simple mechanism for reducing output impedance without introducing the disadvantages previously discussed.

A further problem is to devise a push-pull amplifier that has a simple mechanism for enabling conduction of a quiescent current at high load currents, for preventing active output device cut-off and associated crossover distortion, without introducing the disadvantages previously discussed. Further problems will become clear from the detailed description of the invention.

SUMMARY OF THE INVENTION

An electronic push-pull amplifier and a method in accordance with the current invention provide a solution to the aforementioned problems and to other related problems.

A push-pull amplifier according to the invention comprises:
  a sourcing current sense resistor for facilitating sensing of a sourcing current through an output stage sourcing current path of the push-pull amplifier, the sourcing current sense resistor being located in the output stage sourcing current path such as in series with a drain or source terminal of a sourcing active output device, e.g. an N-channel DMOSFET,
  a sinking current sense resistor for facilitating sensing of a current through an output stage sinking current path of the push-pull amplifier, the sinking current sense resistor being located in the output stage sinking current path such as in series with a drain or source terminal of a sinking active output device, e.g. an N-channel DMOSFET,
  a quiescent current control means for controlling a quiescent current through the output stage sourcing circuitry and sinking circuitry in response to the least one of the sourcing current and the sinking current through the output stage sourcing circuitry and sinking circuitry, respectively,
  drive circuitry for controlling the sourcing and sinking active output devices, said drive circuitry providing a first and a second control voltage directly associated to a respective shared terminal of the active output devices.

A method according to the invention comprises the steps of:
  sensing a sourcing current through sourcing circuitry of an output stage of a push-pull amplifier, by sensing a first voltage across a sourcing sense resistive device arranged in a sourcing current path of the output stage, sensing a sinking current through a sinking circuitry of the output stage, by sensing a second voltage across a sinking sense resistive device arranged in a sinking current path of the output stage, producing in response to the sourcing current and the sinking current a bias control signal representative of the least one of the sourcing current and the sinking current, said bias control signal being proportional to the least one of the sourcing current and the sinking current, symmetrically controlling a sourcing bias voltage and a sinking bias voltage in response to the bias control signal, referencing an output stage sourcing control signal directly to a shared terminal of a sourcing active output device, for avoiding forming a local feedback loop that includes the sourcing active output device, referencing an output stage sinking control signal directly to a shared terminal of a sinking active output device, for avoiding forming a local feedback loop that includes the sinking active output device.

Through the invention, output impedance of a push-pull amplifier decreases because of the absence of degeneration resistors relating to the active output devices. Current sensing for sensing of a current conducted through the output stage sourcing circuitry and a current through the output stage sinking-circuitry is unobtrusive with respect to current delivery to the load since voltages across current sense resistors do not affect output stage control signals in a local feedback fashion. Moreover, distortion decreases since a substantially constant quiescent current is conducted through sinking and sourcing active output devices irrespective of the presence or absence of a large load current. Furthermore, stability is improved because less global voltage feedback is required for a given output impedance or distortion level.

BRIEF DESCRIPTION OF DRAWINGS

The invention is illustrated in the accompanying drawings in which.

DETAILED DESCRIPTION OF THE INVENTION

Figure 1:
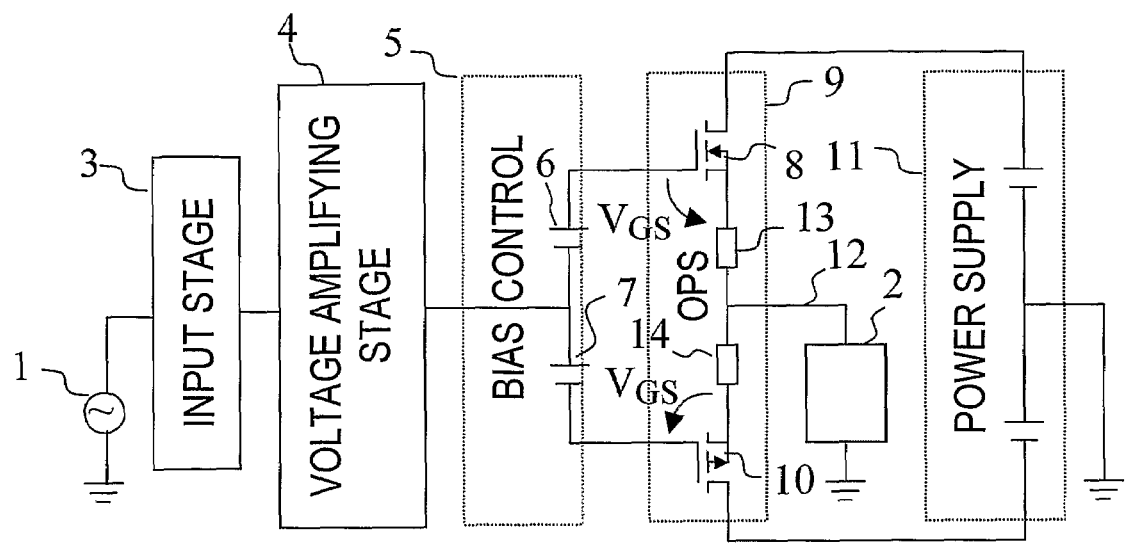
FIG. 1 is an electrical circuit diagram schematically showing a conventional common collector push-pull type amplifier.

The invention will now be described in more detail. The invention is applicable to push-pull type power amplifiers generally having an input amplifying stage, intermediate amplifying stages and an Output Power amplifying Stage (OPS). The output stage has power amplifying active output devices. These are typically Bipolar Junction Transistors (BJTs) or Field Effect Transistors (FETs), but may also be valves, Insulated Gate Bipolar Transistors (IGBTs) or perhaps other exotic amplifying devices. Henceforth, these will be referred to simply as active output devices. Power amplifying active output devices being BJTs or FETs will be denoted output transistors.

In its simplest form, a push-pull type OPS has a sourcing active output device that sources current from a positive terminal of a power supply, and a sinking active output device that sinks current to a negative terminal of the power supply. The terminals of the power supply are substantially voltage sources.

There are basically two types of OPS topologies. The first type is called Common Collector (CC), also known as emitter follower or source follower, and the second type is called Common Emitter (CE). These topologies are relevant irrespective of the type of output devices used, e.g. BJTs or FETs. Complementary pairs of power transistors are most commonly used, i.e. transistors that have different polarity such as an NPN and a PNP transistor, or an N-channel and a P-channel transistor. However, there also exist variations where active output devices of one and the same polarity form an OPS. Such an OPS is called quasi-complementary. The invention is applicable to amplifiers having an OPS of any of these types.

To an OPS, there are applied an output stage sourcing control signal and an output stage sinking control signal. In a CC-type OPS, the output stage sourcing and sinking control signals are traditionally referenced to the output of the output stage, while the output stage sourcing and sinking control signals in a CE-type OPS are traditionally referenced to the respective supply terminals of the power supply.

Active output devices are substantially three terminal devices. A valve has additional terminals, e.g. for heating, but the principal terminals are a gate terminal, an anode terminal and a cathode terminal. Correspondingly, a BJT has a base terminal, a collector terminal and an emitter terminal, while a FET has a gate terminal, a drain terminal and a source terminal.

A signal for controlling an active output device is applied at a control side of the active output device, between the gate or base terminal and a terminal shared between the control side and a side that carries a signal amplified by the active output device in response to the control signal applied at the control side. The shared terminal is the cathode terminal for valves, emitter terminal for BJTs and source terminal for FETs.

It is to be observed that output stage control signals are different from control signals applied at the control side of active output devices for output stages having degeneration resistors related to the active output devices. For example, an output stage control signal may be a voltage applied between a gate terminal of an active output device and an output node of an OPS, while an active output device control signal is a voltage applied directly between a gate terminal and a source terminal of the active output device.

In FIG. 1 there is shown schematically a simplified circuit diagram of a conventional amplifier having a CC type OPS. An input signal generator 1 and a load 2 are also shown. A first terminal of the input signal generator is connected to an input of an input stage 3. A second terminal of the signal generator 1 is connected to ground. An output of the input stage 3 is connected to an input of a Voltage Amplifying Stage (VAS) 4. An output of the VAS 4 is connected to an input of a bias control circuit 5. The bias control circuit 5 has a first bias voltage source 6 and a second bias voltage source 7. The output of the VAS 4 is connected to a negative terminal of the first bias voltage source 6 and to a positive terminal of the second bias voltage source 7. A positive terminal of the first bias voltage source 6 is connected to a gate terminal of an N-channel FET 8 belonging to an OPS 9. A negative terminal of the second bias voltage source 7 is connected to a gate terminal of a P-channel FET 10 of the OPS 9. A drain terminal of the N-channel FET 8 is connected to a positive terminal of a power supply 11, and a source terminal of the N-channel FET 8 is connected to an output node 12, via a first degeneration resistor 13, also known as an emitter resistor or source resistor depending on type of output device. A drain terminal of the P-channel FET 10 is connected to a negative terminal of the power supply 11, and a source terminal of the N-type FET 8 is connected to the output node 12 via a second degeneration resistor 14. The output node 12 constitutes a junction point between sourcing and sinking circuitry of the OPS 9, to which the load 2 or an output network is also connected. As illustrated, the output node 12 is connected directly to a first terminal of the load 2. A second terminal of the load 2 is connected to ground. The power supply 11 is also connected to ground, to a voltage potential halfway between the voltages of the positive and negative terminals.

The N-channel FET 8 and the P-channel FET 10 constitute the active output devices of the OPS 9. The N-channel FET 8 is henceforth referred to as sourcing FET 8, and the P-channel FET 10 as sinking FET 10. The arrangement of degeneration resistors 13,14 is a means to provide negative quiescent-current feedback, for simplifying biasing.

Control of quiescent current becomes less critical since the quiescent current becomes less dependent on device property variations caused e.g. by changing temperature. Also, a larger change of bias control voltage from the bias voltage sources 6,7 is required for achieving a certain change of quiescent current, which simplifies biasing.

It is to be specifically noted however that conduction of current through the sourcing FET 8 or sinking FET 10 as a negative side effect is deteriorated because of their respective degeneration resistor 13,14. A load current increase brought about e.g. by a reduction of load impedance or by a change of voltage applied at the gate terminal of the sourcing FET 8 or sinking FET 10 is counteracted by a voltage increase developed across the corresponding degeneration resistor 13,14 as a result of the load current increase. The latter voltage increase suppresses an increase of a voltage $V_{GS}$ between the gate terminal and the source terminal of the corresponding sourcing FET 8 or sinking FET 10. Consequently, an increase of the load current is not as large as it would otherwise have been.

In other words, the output impedance increases as a result of the degeneration resistors 13,14. Moreover, the amplifier is a less perfect voltage source as a result of the degeneration resistors 13,14, i.e. the output voltage at the output node 12 changes more than it otherwise would when load impedance changes, and less than it otherwise would when the voltage applied at the gate terminal changes.

Figure 2:
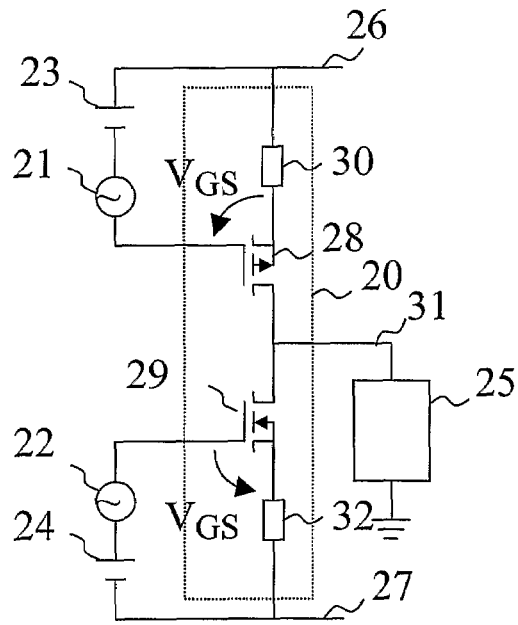
FIG. 2 is an electrical circuit diagram showing an output stage of a conventional common emitter push-pull amplifier.

In FIG. 2 there is shown a circuit diagram of a conventional CE-type OPS 20, a first control signal generator 21, a second control signal generator 22, a first bias voltage source 23, a second bias voltage source 24, a load 25, a positive voltage supply terminal 26 and a negative voltage supply terminal 27. A positive terminal of the first bias voltage source 23 is connected to the positive voltage supply terminal 26. A negative terminal of the first bias voltage source 23 is connected to a first terminal of the first control signal generator 21. A second terminal of the first control signal generator 21 is connected to a gate terminal of a P-channel FET 28 belonging to the OPS 20. A negative terminal of the second bias voltage source 24 is connected to the negative voltage supply terminal 27. A positive terminal of the second bias voltage source 24 is connected to a first terminal of the second control signal generator 22. A second terminal of the second control signal generator 22 is connected to a gate terminal of the N-channel FET 29 belonging to the OPS 20. A source terminal of the P-channel FET 28 is connected to the positive voltage supply terminal 26 via a first degeneration resistor 30. A drain terminal of the P-channel FET 28 is connected to an output node 31. A source terminal of the N-channel FET 29 is connected to the negative voltage supply terminal 27 via a second degeneration resistor 32. A drain terminal of the N-channel FET 29 is connected to the output node 31. The output node 31 is connected to a first terminal of the load 25. A second terminal of the load 25 is connected to ground.

The degeneration resistors 30,32 increase the output impedance of the OPS 20. The rationale is similar as for the CC-type OPS. Accordingly, an increase of load current increases a voltage across the corresponding degeneration resistor 30 or degeneration resistor 32. The current increase is counteracted by a resulting reduction of control voltage $V_{GS}$ directly resulting from the voltage increase across the degeneration resistor 30 or degeneration resistor 32.

In conventional output stages, the output impedance is thus disadvantageously affected by the presence of degeneration resistors. A degeneration resistor and its related active output device form a negative feedback loop that is obtrusive with respect to current delivery to a load, irrespective of whether the CC-type or the CE-type OPS is used. This type of passive resistor feedback is known in the art as local feedback.

According to an important aspect of the invention, a sourcing current sense resistor for facilitating sensing of a current being conducted through an OPS sourcing circuitry is arranged within the OPS sourcing circuitry, in a manner such that a local feedback loop of the aforementioned type is not formed.

Furthermore, a sinking current sense resistor for facilitating sensing of a current being conducted through the OPS sinking circuitry is arranged within the OPS sinking circuitry, in a manner such that a local feedback loop of the aforementioned type is not formed.

The sourcing current sense resistor and the sinking current sense resistor are thus distinct from being included in a respective local feedback loop, and therefore are unobtrusive with respect to the current to/from the load.

It is further to be observed that in a push-pull type amplifier, when a load current is conducted it is either conducted through sourcing circuitry or through sinking circuitry of an OPS at any given time. Load current conducted through the sourcing circuitry and load current conducted through the sinking circuitry are mutually exclusive.

In addition, assuming there is a continuous quiescent current, the quiescent current is simultaneously conducted through both the sourcing circuitry and the sinking circuitry of the OPS.

Accordingly, when a load current is conducted through the sourcing circuitry, a larger aggregated current being the sum of the load current and the quiescent current is actually conducted through the sourcing circuitry, while the quiescent current alone is conducted through the sinking circuitry.

Conversely, when a load current is conducted through the sinking circuitry, a larger aggregated current being the sum of the load current and the quiescent current is actually conducted through the sinking circuitry, while the quiescent current alone is conducted through the sourcing circuitry.

The aggregated current, i.e. the sum of the load current and the quiescent current is referred to as sourcing current or sinking current depending on whether current is conducted via the sourcing circuitry or the sinking circuitry.

At any one time in the presence of a load current, the least one of currents through the sourcing and sinking circuitry of the OPS is consequently the actual quiescent current. In the absence of a load current, the currents through the sourcing and sinking circuitry are one and the same, namely the quiescent current.

These observations are the basis for another important aspect of the invention, according to which the least one alone of the current through the sourcing circuitry and the current through the sinking circuitry is determinative of a signal produced. The signal controls the quiescent current through a negative feedback loop arrangement for substantially keeping the quiescent current constant.

More specifically, a sourcing current signal representative of a current through the sourcing circuitry sensed through a voltage across the sourcing current sense resistor is compared with a sinking current signal representative of a current through the sinking circuitry sensed through a voltage across the sinking current sense resistor. The one of the sourcing current signal and the sinking current signal that has a value representing the least current, or any one of the signals should they represent one and the same current, is determinative of a bias control signal produced, while the signal having a value representing the larger current is recessive, i.e. has no influence on the control signal produced. The bias control signal is proportional to the determinative current and to the determinative current signal.

Figure 3:
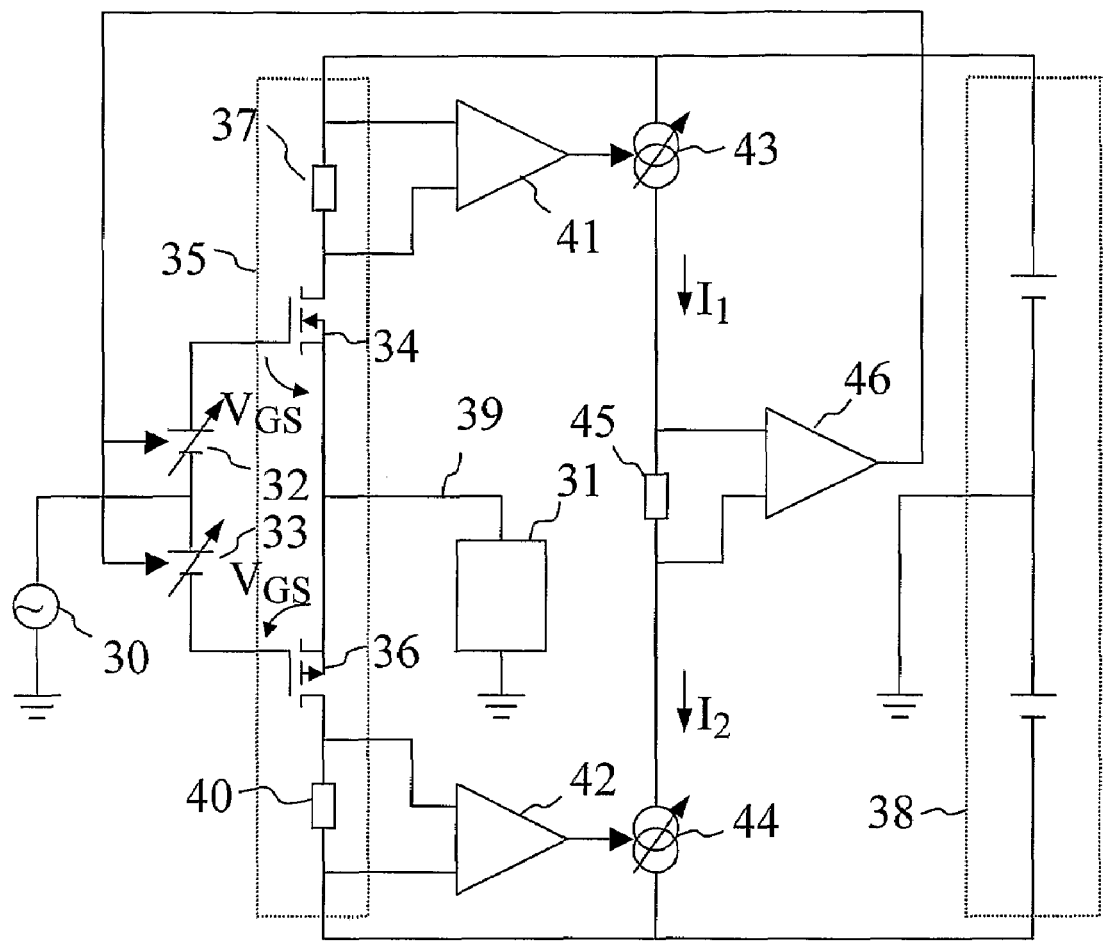
FIG. 3 is an electrical circuit diagram showing schematically an amplifier according to the invention.

The invention will be further explained with reference to FIG. 3, that schematically shows a first embodiment of an amplifier in accordance with the invention, an input signal generator 30 connected to an input of the amplifier and a load 31 connected to an output of the amplifier.

A first terminal of the input signal generator 30 is connected to ground. A second terminal of the input signal generator 30 is connected to a negative terminal of a first programmable constant voltage generator 32 of a biasing stage and to a positive terminal of a second programmable constant voltage generator 33 of the biasing stage. A positive terminal of the first voltage generator 32 is connected to a gate terminal of an N-channel FET 34 residing in an OPS 35. A negative terminal of the second voltage generator 33 is connected to a gate terminal of a P-channel FET 36 also residing in the OPS. A sourcing current sense resistor 37 within the OPS 35 has a first terminal that is connected to a positive terminal of a power supply 38. A second terminal of the sourcing current sense resistor 37 is connected to a drain terminal of the N-channel FET 34. A source terminal of the N-channel FET 34 is connected directly to an output node 39. The output node 39 is connected to a first terminal of the load 31. A second terminal of the load 31 is connected to ground. The output node 39 is also connected directly to a source terminal of the P-channel FET 36. A drain terminal of the P-channel FET 36 is connected to a first terminal of a sinking current sense resistor 40 within the OPS 35. A second terminal of the sinking current sense resistor 40 is connected to a negative terminal of the power supply 38. A voltage mid-point terminal of the power supply 38 is connected to ground.

Furthermore, the first and the second terminal of the sourcing current sense resistor 37 are connected to a respective input of an amplifier 41 of a sourcing current sensing circuitry. The first and the second terminal of the sinking current sense resistor 40 are connected to a respective input of an amplifier 42 of a sinking current sensing circuitry. An output of the sourcing current sensing circuitry is connected to a control input of a sourcing programmable constant-current generator 43. An output of the sinking current sensing circuitry is connected to a control input of a sinking programmable constant-current generator 44. A supply terminal of the sourcing current generator 43 is connected to the positive terminal of the power supply 38. A current source terminal of the sourcing current generator 43 is connected to a first terminal of a least current determining resistor 45. A second terminal of the least current determining resistor 45 is connected to a current sink terminal of the sinking current generator 44. A supply terminal of the sinking current generator 44 is connected to the negative terminal of the power supply 38. The first and the second terminals of the least current determining resistor 45 are connected to a least current determining differential amplifier 46. An output of the least current determining differential amplifier 46 is connected to a respective control input of the first voltage generator 32 and to the second voltage generator 33 of the biasing stage.

The input signal generator 30 represents e.g. a VAS. Programmable DC offsets are accomplished by means of the programmable constant-voltage generators 32,33 that constitute part of a biasing circuitry. The output signal from the input signal generator 30 is voltage level-shifted and separated into a first and a second control signal for controlling the N-channel FET 34 and the P-channel FET 36 respectively. The N-channel FET 34 and the P-channel FET 36 are power handling active output devices that carry a load current.

Current sensing circuitry is arranged for producing a first control current and a second control current. The current sensing circuitry senses a first voltage across the sourcing current sense resistor 37, and in response thereto feeds a control signal to a control input of the sourcing programmable constant-current generator 43. Moreover, the current sensing circuitry senses a second voltage across the sinking current sense resistor 40, and in response thereto feeds a control signal to a control input of the sinking programmable constant-current generator 44.

The sourcing current generator 43 produces a first current $I_1$ and the sinking current generator 44 produces a second current $I_2$. When the current generators 43,44 operate in their linear, non-saturated region, the first and second currents produced are proportional to the respective currents through the sourcing circuitry and the sinking circuitry of the OPS. This is the case when the first current equals the second current, i.e. when there is no current through the load 31.

The sourcing current generator 43 sources the first current $I_1$ to a first terminal of a least current determining resistor 45, and the sinking current generator 44 sinks the second current $I_2$ from a second terminal of the least current determining resistor 45. The voltage across the least current determining resistor 45 represents a current through the least current determining resistor 45, which current is equal to the least one of the current through the sourcing circuitry and the current through the sinking circuitry of the OPS 35.

This is so because the current going into the least current determining resistor 45 is equal to the current going out from the least current determining resistor 45. Consequently, the one of the current generator 43 or the current generator 44 attempting to source or sink a current being the larger one is saturated.

As a consequence, the least one of the current through the sourcing,circuitry and the current through the sinking circuitry of the OPS 35 becomes determinative of the current through the least current determining resistor 45. A voltage across the least current determining resistor 45 is thus a proportional representation of the least one of the current through the sourcing circuitry and the current through the sinking circuitry of the OPS 35.

The quiescent current is controlled through a negative feedback loop in response to the voltage across the least current determining resistor 45, which voltage thus further represents the quiescent current. In more detail, the voltage across the least current determining resistor 45 is sensed through the least current determining differential amplifier 46. The least current determining differential amplifier 46 feeds a signal representing the least current to the programmable constant-voltage generator 32 and to the programmable constant-voltage generator 33. An increase of the voltage across the least current determining resistor 45 results in a signal from the least current determining differential amplifier 46 being such that the biasing voltages across both programmable constant-voltage generators 32,33 decrease and vice versa.

It is to be particularly noted that the current sense resistors 37,40 are not degeneration resistors. There are no degeneration resistors in the output stage 35 for the output transistors 34,36.

A change of load current or quiescent current is not counteracted by means of local feedback since an associated change of voltage across a current sense resistor 37,40 does not yield a direct and passively induced change of control voltage $V_{GS}$.

Moreover, the bias voltages are equal. Bias regulation is thus symmetric, which is advantageous with respect to distortion.

The invention will now be further explained with reference to FIG. 4, that shows an embodiment in closer detail. An input signal generator 50 has a first terminal connected to ground, and a second terminal connected to a first terminal of a sourcing bias voltage resistor 51 and to a first terminal of a sinking bias voltage resistor 52. A second terminal of the sourcing bias voltage resistor 51 is connected to a collector terminal of a PNP-transistor 53 and to a gate terminal of an N-channel FET 54. A base terminal of the PNP-transistor 53 is connected to a negative terminal of a voltage source 55. A positive terminal of the voltage source 55 is connected to a positive terminal of a first supplementary voltage supply 56. An emitter terminal of the PNP-transistor 53 is connected to a first terminal of a resistor 57. A second terminal of the resistor 57 is connected to an emitter terminal of an NPN-transistor 58. A collector terminal of the NPN-transistor 58 is connected to the positive terminal of the first supplementary voltage supply 56. A drain terminal of the N-channel FET 54 is connected to a first terminal of a sourcing current sense resistor 59 and to a first terminal of a resistor 60. A second terminal of the sourcing current sense resistor 59 is connected to a positive terminal of a sourcing voltage supply 61 and to a negative terminal of the first supplementary voltage supply 56. A second terminal of the resistor 60 is connected to a collector terminal of a PNP-transistor 62 and to a base terminal of an NPN-transistor 63. An emitter terminal of the PNP-transistor 62 is connected to a first terminal of a resistor 64. A second terminal of the resistor 64 is connected to the positive terminal of the first supplementary voltage supply 56. An emitter terminal of the NPN-transistor 63 is connected to a first terminal of a resistor 65. A collector terminal of the NPN-transistor 63 is connected to a first terminal of a resistor 66. A second terminal of the resistor 65 is connected to a first terminal of a constant current generator 67 and to a first terminal of a resistor 68. A second terminal of the constant current generator 67 is connected to ground. A second terminal of the resistor 68 is connected to an emitter terminal of an NPN-transistor 69. A collector terminal of the NPN-transistor 69 is connected to a first terminal of a resistor 70 and to a base terminal of a PNP-transistor 71. A second terminal of the resistor 70 is connected to the positive terminal of the first supplementary voltage supply 56. An emitter terminal of the PNP-transistor 71 is connected to a base terminal of the PNP-transistor 62 and to a first terminal of a resistor 72. A second terminal of the resistor 72 is connected to the positive terminal of the first supplementary voltage supply 56. A collector terminal of the PNP-transistor 71 is connected to a base terminal of an NPN-transistor 73 and to a first terminal of a resistor 74. A collector terminal of the NPN-transistor 73 is connected to a first terminal of a resistor 75 and to a base terminal of the NPN-transistor 58. A second terminal of the resistor 75 is connected to the positive terminal of the first supplementary voltage supply 56. An emitter terminal of the NPN-transistor 73 is connected to a first terminal of a resistor 76. A negative terminal of the sourcing voltage supply 61 is connected to ground.

Furthermore, a second terminal of the sinking bias voltage resistor 52 is connected to a collector terminal of an NPN-transistor 90 and to a gate terminal of a P-channel FET 91. A base terminal of the NPN-transistor 90 is connected to a positive terminal of a voltage source 92. A negative terminal of the voltage source 92 is connected to a negative terminal of a second supplementary voltage supply 93. An emitter terminal of the NPN-transistor 90 is connected to a first terminal of a resistor 94. A second terminal of the resistor 94 is connected to an emitter terminal of a PNP-transistor 95. A collector terminal of the PNP-transistor 95 is connected to the negative terminal of the second supplementary voltage supply 93. A drain terminal of the P-channel FET 91 is connected to a first terminal of a sinking current sense resistor 96 and to a first terminal of a resistor 97. A second terminal of the sinking current sense resistor 96 is connected to a negative terminal of a sinking voltage supply 98 and to a positive terminal of the second supplementary voltage supply 93. A second terminal of the resistor 97 is connected to a collector terminal of an NPN-transistor 99 and to a base terminal of a PNP-transistor 100. An emitter terminal of the PNP-transistor 99 is connected to a first terminal of a resistor 101. A second terminal of the resistor 101 is connected to the negative terminal of the second supplementary voltage supply 93. An emitter terminal of the PNP-transistor 100 is connected to a first terminal of a resistor 102. A collector terminal of the PNP-transistor 100 is connected to a first terminal of a resistor 103. A second terminal of the resistor 102 is connected to a first terminal of a constant current generator 104 and to a first terminal of a resistor 105. A second terminal of the constant current generator 104 is connected to ground. A second terminal of the resistor 105 is connected to an emitter terminal of a PNP-transistor 106. A collector terminal of the PNP-transistor 106 is connected to a first terminal of a resistor 107 and to a base terminal of a NPN-transistor 108. A second terminal of the resistor 107 is connected to the negative terminal of the second supplementary voltage supply 93. An emitter terminal of the NPN-transistor 108 is connected to a base terminal of the NPN-transistor 99 and to a first terminal of a resistor 109. A second terminal of the resistor 109 is connected to the negative terminal of the second supplementary voltage supply 93. A collector terminal of the NPN-transistor 108 is connected to a base terminal of a PNP-transistor 110 and to a second terminal of the resistor 74. A collector terminal of the PNP-transistor 110 is connected to a first terminal of a resistor 111 and to a base terminal of the PNP-transistor 95. A second terminal of the resistor 111 is connected to the negative terminal of the second supplementary voltage supply 93. An emitter terminal of the PNP-transistor 110 is connected to the second terminal of the resistor 76. A source terminal of the N-channel FET 54 and the P-channel FET 91 respectively are connected to a first terminal of a load 112. A second terminal of the load is connected to ground. A positive terminal of the sinking voltage supply 98 is connected to ground.

The sourcing current sense resistor 59, the sinking current sense resistor 96, the N-channel FET 54 and the P-channel FET 91 constitute a source-follower, i.e. CC-type OPS, where the N-channel FET 54 and the P-channel FET 91 are active output devices. Sensing of a sourcing current $I_{D1}$ through the N-channel FET 54 and a sinking current $I_{D2}$ through the P-channel FET 91 is accomplished by sensing a respective voltage across the sourcing current sense resistor 59 and the sinking current sense resistor 96.

Voltage sensing in turn is accomplished by a respective so-called long-tailed-pair. The first long-tailed pair includes the transistor 63, the transistor 69, the resistor 65, the resistor 68, the constant current generator 67, the resistor 66 and the resistor 70. The second long-tailed pair includes the transistor 100, the transistor 106, the resistor 102, the resistor 105, the constant current generator 104, the resistor 103 and the resistor 107. In the current embodiment, a respective resistor is a good approximation of said constant current generators 67,104.

The long-tailed pairs are included in a respective differential amplifier. The first differential amplifier also contains the transistor 71 and the resistor 72, and the second differential amplifier also contains the transistor 108 and the resistor 109. The transistor 71 and the resistor 72 produce a constant current $I_{C1}$ in response to a differential voltage applied across inputs of the first differential amplifier, and the transistor 108 and the resistor 109 produce a constant current $I_{C2}$ in response to a differential voltage applied across inputs of the second differential amplifier. The inputs are applied across the respective current sense resistors 59,96, via resistors 60, 97. The function of the resistors 60,97 will now be explained.

The constant current $I_{C1}$ constitutes an output signal of the first differential amplifier and $I_{C2}$ constitutes an output signal of the second differential amplifier.

The transistor 62, the resistor 64 and the resistor 60 are arranged to provide negative feedback on the current $I_{C1}$ produced at the output of the first differential amplifier. A voltage is sensed across the resistor 72, which voltage represents the current $I_{C1}$, and a proportional voltage is produced across the resistor 60, thus causing negative feedback.

Conversely, the transistor 99, the resistor 101 and the resistor 97 are arranged to provide negative feedback on the current $I_{C2}$ produced at the output of the second differential amplifier. A voltage is sensed across the resistor 109, which voltage represents the current $I_{C2}$, and a proportional voltage is produced across the resistor 97, thus causing negative feedback.

The negative feedback arrangement just discussed reduces effects of process variations, i.e. parameter variations between components caused by manufacturing tolerances, and thermal variations. As a result, the currents $I_{C1}$ and $I_{C2}$ become highly accurate.

The current $I_{C1}$ is a proportional representation of the current $I_{D1}$, provided the transistor 71 operates in its linear operating range, while the current $I_{C2}$ is a proportional representation of the current $I_{D2}$, provided the transistor 108 operates in its linear operating range. However, the transistor 71 sources a current $I_{C1}$ into the resistor 74, and the transistor 107 sinks a current $I_{C2}$ from the resistor 74. It follows from Kirchoff's Current Law, stating that the algebraic sum of currents entering or leaving a node must equal zero, that in the presence of a load current, either the transistor 71 has a larger current sourcing capability than the current sinking capability of the transistor 108, or the transistor 108 has a larger current sinking capability than the current sourcing capability of the transistor 71. Consequently, either the transistor 71 saturates, or the transistor 108 saturates.

Accordingly, a current $I_{C1}$ or $I_{C2}$ will not represent a larger one of the currents $I_{D1}$ or $I_{D2}$, but will be recessed so that the currents $I_{C1}$ and $I_{C2}$ become substantially equal. The currents $I_{C1}$ and $I_{C2}$ as a result are both representative of the smaller one of the currents $I_{D1}$ and $I_{D2}$, i.e. the quiescent current. Consequently, the voltage across the resistor 74 represents the quiescent current.

A differential amplifying circuit containing the transistor 73, the transistor 110, the resistor 76, the resistor 75 and the resistor 111 amplifies the voltage across the resistor 74. A first and a second output from the differential amplifying circuit controls a respective programmable constant current generator, one of which consists of the transistor 58, the resistor 57 and the transistor 53 and the voltage source 55, and the other one consisting of the transistor 95, the resistor 94 and the transistor 90 and the voltage source 92.

Currents produced by the programmable constant current generators generate a respective voltage across the resistors 51,52. These voltages are bias voltages. The bias voltages determine the quiescent current, while a voltage of the input signal generator 50 substantially determines a voltage at the load 112, i.e. at the output of the OPS.

The input signals of the OPS are a respective OPS control voltage applied to the gate terminals of the active output devices 54,91. Since the OPS is a basic source follower, the OPS control voltages are referenced to the voltage at the output of the OPS. Because of the absence of degeneration resistors, an OPS control voltage and a voltage $V_{GS}$ between the gate terminal and the source terminal of the related active output device are one and the same, regardless of load current.

Therefore, the OPS departs from unity voltage gain in the presence of a load current only as determined by the finite transconductance of the active output devices. Transconductance is the change of drain current $I_D$ brought about by a (one volt) change of voltage $V_{GS}$ between the gate terminal and the source terminal of an output transistor.

Provided the transconductance is sufficiently large, the amplifier is thus substantially load-invariant, i.e. the output voltage is substantially unaffected by varying load impedance.

The input signal generator 50 typically represents an input stage and a VAS. The currents of the programmable constant current generators are substantially equal. Accordingly, the constant current generators do not constitute a load on the input signal generator 50.

Furthermore, voltages across the resistor 51 and the resistor 52 are equal and the overall circuitry is arranged in a way such that bias control affects both the sourcing active output device, i.e. the N-channel FET 54, and the sinking active output device, i.e. the P-channel FET 91, equally. Biasing is thus symmetric.

Figure 5:
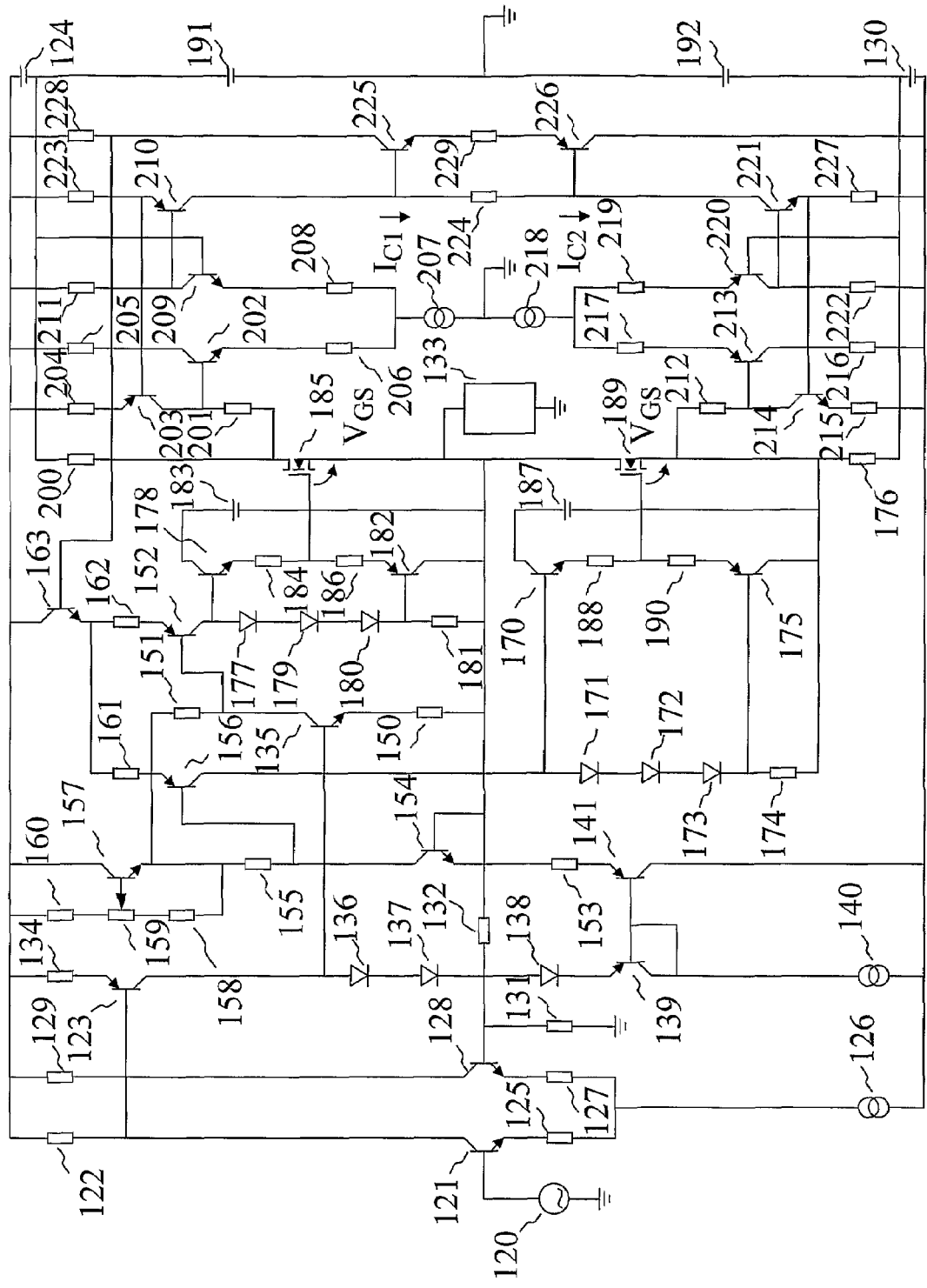
FIG. 5 is an electrical circuit diagram showing a quasi-complementary MOSFET power amplifier incorporating a biasing scheme according to the invention.

The invention will now be further explained with reference to FIG. 5, which shows another embodiment of the invention. An input signal generator 120 has a first terminal connected to ground. A second terminal of the input signal generator 120 is connected to a base terminal of an NPN-transistor 121. A collector terminal of the NPN-transistor 121 is connected to a first terminal of a resistor 122 and to a base terminal of a PNP-transistor 123. A second terminal of the resistor 122 is connected to a positive terminal of a first supplementary voltage supply 124. An emitter terminal of the NPN-transistor 121 is connected to a first terminal of a resistor 125. A second terminal of the resistor 125 is connected to a first terminal of a current generator 126 and to a first terminal of a resistor 127. A second terminal of the resistor 127 is connected to an emitter terminal of an NPN-transistor 128. A collector terminal of the NPN-transistor 128 is connected to a first terminal of a resistor 129. A second terminal of the resistor 129 is connected to the first supplementary voltage supply 124. A second terminal of the current generator 126 is connected to a second supplementary voltage supply 130. A base terminal of the NPN-transistor 128 is connected to a first terminal of a resistor 131 and to a first terminal of a resistor 132. A second terminal of the resistor 132 is connected to a first terminal of a load 133. A second terminal of the load 133 is connected to ground. A base terminal of the PNP-transistor 123 is connected to a first terminal of a resistor 134. A collector terminal of the PNP-transistor 123 is connected to a base terminal of an NPN-transistor 135 and to an anode terminal of a diode 136. A cathode terminal of the diode 136 is connected to an anode terminal of a diode 137. A cathode terminal of the diode 137 is connected to an anode terminal of a diode 138. A cathode terminal of the diode 138 is connected to an emitter terminal of a PNP-transistor 139. A collector terminal of the PNP-transistor 139 is connected to a first terminal of a current generator 140. A second terminal of the current generator 140 is connected to the negative terminal of the second supplementary voltage supply 130. A base terminal of the PNP-transistor 139 is connected to the collector terminal of the PNP-transistor 139 and to a base terminal of a PNP-transistor 141.

An emitter terminal of the NPN-transistor 135 is connected to a first terminal of a resistor 150. A second terminal of the resistor 150 is connected to the first terminal of the load 133. A collector terminal of the NPN-transistor 135 is connected to a first terminal of a resistor 151 and to a base terminal of a PNP-transistor 152. A collector terminal of the PNP-transistor 141 is connected to the negative terminal of the second supplementary voltage supply 130. An emitter terminal of the PNP-transistor 141 is connected to a first terminal of a resistor 153. A second terminal of the resistor 153 is connected to an emitter terminal of an NPN-transistor 154. A base terminal of the NPN-transistor 154 is connected to the first terminal of the load 133. A collector terminal of the NPN-transistor 154 is connected to a first terminal of a resistor 155 and to a base terminal of a PNP-transistor 156. A second terminal of the resistor 151 and a second terminal of the resistor 155 are connected to an emitter terminal of an NPN-transistor 157 and to a first terminal of a resistor 158. A second terminal of the resistor 158 is connected to a first terminal of a potentiometer 159. A wiper terminal of the potentiometer 159 is connected to a base terminal of the NPN-transistor 157. A second terminal of the potentiometer 159 is connected to a first terminal of a resistor 160. A second terminal of the resistor 160 is connected to the positive terminal of the first supplementary voltage supply 124. A collector terminal of the NPN-transistor 157 is connected to the positive terminal of the first supplementary voltage supply 124.

An emitter terminal of the PNP-transistor 156 is connected to a first terminal of a resistor 161. An emitter terminal of the PNP-transistor 152 is connected to a first terminal of a resistor 162. A second terminal of the resistor 161 and a second terminal of the resistor 162 are connected to an emitter terminal of an NPN-transistor 163. A collector terminal of the NPN-transistor 163 is connected to the positive terminal of the first supplementary voltage supply 124. A collector terminal of the PNP-transistor 156 is connected to a base terminal of an NPN-transistor 170 and to an anode terminal of a diode 171. A cathode terminal of the diode 171 is connected to an anode terminal of a diode 172. A cathode terminal of the diode 172 is connected to an anode terminal of a diode 173. A cathode terminal of the diode 173 is connected to a first terminal of a resistor 174 and to a base terminal of a PNP-transistor 175. A second terminal of the resistor 174 is connected to a first terminal of a current sense resistor 176.

A collector terminal of the PNP-transistor 152 is connected to an anode terminal of a diode 177 and to a base terminal of an NPN-transistor 178. A cathode terminal of the diode 177 is connected to an anode terminal of a diode 179. A cathode terminal of the diode 179 is connected to an anode terminal of a diode 180. A cathode terminal of the diode 180 is connected to a first terminal of a resistor 181 and to a base terminal of a PNP-transistor 182. A second terminal of the resistor 181 is connected to the first terminal of the load 133. A collector terminal of the NPN-transistor 178 is connected to a positive terminal of a third supplementary voltage supply 183. An emitter terminal of the NPN-transistor 178 is connected to a first terminal of a resistor 184. A second terminal of the resistor 184 is connected to a gate terminal of a first N-channel FET 185 and to a first terminal of a resistor 186. A second terminal of the resistor 186 is connected to an emitter terminal of the PNP-transistor 182. A collector terminal of the PNP-transistor 182 is connected to the first terminal of the load 133. A negative terminal of the third supplementary voltage supply 183 is connected to the first terminal of the load 133. A collector terminal of the NPN-transistor 170 is connected to a positive terminal of a fourth supplementary voltage supply 187. An emitter terminal of the NPN-transistor 170 is connected to a first terminal of a resistor 188. A second terminal of the resistor 188 is connected to a gate terminal of a second N-channel FET 189 and to a first terminal of a resistor 190. A second terminal of the resistor 190 is connected to a base terminal of the PNP-transistor 175. A negative terminal of the fourth supplementary voltage supply 187 is connected to the first terminal of the current sense resistor 176. A negative terminal of the first supplementary voltage supply 124 is connected to a positive terminal of a positive power supply 191. A positive terminal of the second supplementary voltage supply 130 is connected to a negative terminal of a negative power supply 192. A negative terminal of the positive power supply 191 and a positive terminal of the negative power supply 192 are connected to ground.

Moreover, a source terminal of the first N-channel FET 185 is connected to the first terminal of the load 133 and to a drain terminal of the second N-channel FET 189. A drain terminal of the first N-channel FET 185 is connected to a first terminal of a current sense resistor 200 and to a first terminal of a resistor 201. A second terminal of the current sense resistor 200 is connected to the positive terminal of the positive power supply 191. A second terminal of the resistor 201 is connected to a base terminal of an NPN-transistor 202 and to a collector terminal of a PNP-transistor 203. An emitter terminal of the PNP-transistor 203 is connected to a resistor 204. A second terminal of the resistor 204 is connected to the positive terminal of the first supplementary voltage supply 124. A collector terminal of the PNP-transistor 202 is connected to a first terminal of a resistor 205. A second terminal of the resistor 205 is connected to the positive terminal of the first supplementary voltage supply 124. An emitter terminal of the NPN-transistor 202 is connected to a first terminal of a resistor 206. A second terminal of the resistor 206 is connected to a first terminal of a third current generator 207 and to a first terminal of a resistor 208. A second terminal of the resistor 208 is connected to an emitter terminal of an NPN-transistor 209. A collector terminal of the NPN-transistor 209 is connected to a base terminal of a PNP-transistor 210 and to a first terminal of a resistor 211. A second terminal of the resistor 211 is connected to the positive terminal of the first supplementary voltage supply 124. A base terminal of the NPN-transistor 209 is connected to the positive terminal of the positive power supply 191. A second terminal of the current generator 207 is connected to ground.

A source terminal of the second N-channel FET 189 is connected to the first terminal of the current sense resistor 176 and to a first terminal of a resistor 212. A second terminal of the resistor 212 is connected to a base terminal of a PNP-transistor 213 and to a collector terminal of an NPN-transistor 214. An emitter terminal of the transistor 214 is connected to a first terminal of a resistor 215. A second terminal of the resistor 215 is connected to the negative terminal of the second supplementary voltage supply 130. A collector terminal of the PNP-transistor 213 is connected to a first terminal of a resistor 216. A second terminal of the resistor 216 is connected to the negative terminal of the second supplementary voltage supply 130. An emitter terminal of the PNP-transistor 213 is connected to a first terminal of a resistor 217. A second terminal of the resistor 217 is connected to a fourth constant current generator 218 and to a first terminal of a resistor 219. A second terminal of the resistor 219 is connected to an emitter terminal of a PNP-transistor 220. A collector terminal of the PNP-transistor 220 is connected to a base terminal of an NPN-transistor 221 and to a first terminal of a resistor 222. A second terminal of the resistor 222 is connected to the negative terminal of the second supplementary voltage supply 130. A base terminal of the PNP-transistor 220 is connected to the negative terminal of the negative power supply 192. A second terminal of the fourth constant current generator 218 is connected to ground.

An emitter terminal of the PNP-transistor 210 is connected to a first terminal of a resistor 223 and to a base terminal of the PNP-transistor 203. A second terminal of the resistor 223 is connected to the positive terminal of the first supplementary voltage supply 124. A collector terminal of the PNP-transistor 210 is connected to a first terminal of a resistor 224 and to a base terminal of an NPN-transistor 225. A second terminal of the resistor 224 is connected to a base terminal of a PNP-transistor 226 and to a collector terminal of the NPN-transistor 221. An emitter terminal of the transistor 221 is connected to a base terminal of the NPN-transistor 214 and to a first terminal of a resistor 227. A second terminal of the resistor 227 is connected to the negative terminal of the second supplementary voltage supply 130. A first terminal of a resistor 228 is connected to the positive terminal of the supplementary voltage supply 124. A second terminal of the resistor 228 is connected to a base terminal of the NPN-transistor 163 and to a collector terminal of the NPN-transistor 225. An emitter terminal of the NPN-transistor 225 is connected to a first terminal of a resistor 229. A second terminal of the resistor 229 is connected to an emitter terminal of the PNP-transistor 226. A collector of the PNP-transistor 226 is connected to the negative terminal of the second supplementary voltage supply 130.

The signal generator 120 generates a signal representative of a low level signal to be amplified by the amplifier. The signal enters at a positive differential input of a differential input stage, at the base terminal of the NPN-transistor 121. The input stage further accommodates the NPN-transistor 128, the resistor 125, the resistor 127, the resistor 122, the resistor 129 and the constant current generator 126. The base terminal of the NPN-transistor 128 constitutes a negative differential input of the differential input stage. The input stage is a first long-tailed pair of the amplifier.

The output of the first long-tailed pair is connected to a VAS. The VAS consists of the resistor 134, the PNP-transistor 123, the diode 136, the diode 137, the diode 138, the PNP-transistor 139, and the constant current generator 140. The VAS has two outputs with a reciprocal voltage difference determined by the aggregated voltage drop across the diodes 136,137,138 and the PNP-transistor 139.

The current sense resistor 200, the current sense resistor 176, the first N-channel FET 185 and the second N-channel FET 189 form a quasi-complementary OPS, where the first N-channel FET 185 and the second N-channel FET 189 are thus active output devices for sourcing and sinking current respectively. Henceforth, these are referred to as sourcing FET 185 and sinking FET 189 respectively. An output of the OPS constitutes the output of the amplifier, the output of which is connectable to a load 133 such as e.g. a loudspeaker.

The one output of the VAS that is positive relative to the other is fed to an input of a sourcing drive circuit whose output is fed to the gate terminal of the sourcing FET 185. The circuit comprises the resistor 151, the NPN-transistor 135, the resistor 150, the resistor 162, the PNP-transistor 152, the diode 177, the diode 179, the diode 180, the resistor 181, the NPN-transistor 178, the resistor 184, the resistor 186, the PNP-transistor 182 and the third supplementary voltage supply 183.

The input signal of the sourcing drive circuit to which the VAS is connected is a voltage applied between the base terminal of the NPN-transistor 135 and the output of the amplifier. The input signal from the VAS is thus referenced directly to the output node of the OPS. The sourcing drive circuit provides an output signal having a voltage gain relative to the source terminal of the first FET 185, e.g. unity gain. The output signal of the sourcing drive circuit is a voltage $V_{GS}$ applied directly between the gate terminal and the source terminal of the sourcing FET 185.

The circuit has two additional inputs. These are for bias voltage control. A circuit comprising the resistor 160, the potentiometer 159, the resistor 158 and the NPN-transistor 157 constitute a voltage source whose output is fed to a first one of said two additional inputs. The voltage source provides a programmable but substantially static control voltage for controlling the bias voltage of the sourcing FET 185, and in turn controlling the quiescent current of the OPS. The voltage is referenced to the positive terminal of the first supplementary voltage supply 124. The second one of said two additional inputs is fed from a voltage provided at the emitter terminal of the NPN-transistor 163.

The one output of the VAS that is negative relative to the other is fed to an input of a sinking drive circuit whose output is fed to the gate terminal of the sinking FET 189. The circuit comprises the PNP-transistor 141, the resistor 153, the NPN-transistor 154, the resistor 155, the resistor 161, the PNP-transistor 156, the diode 171, the diode 172, the diode 173, the resistor 174, the NPN-transistor 170, the resistor 188, the resistor 190, the PNP-transistor 175 and the fourth supplementary voltage supply 187.

The sinking drive circuit is similar in function to the sourcing drive circuit, but the output of the sinking drive circuit is referenced to the source terminal of the sinking FET 189 rather than the source terminal of the sourcing FET 185. The input signal is a voltage applied between the base terminal of the transistor 141 and the output of the amplifier. The input signal from the VAS is thus referenced directly to the output node of the OPS. The gain is substantially the same as the gain of the sourcing drive circuit, although negative. The sinking drive circuit thus inverts a signal at its input. The output signal of the sinking drive circuit is a voltage $V_{GS}$ applied directly between the gate terminal and the source terminal of the sinking FET 189.

The sinking drive circuit also has two additional inputs for bias voltage control, connected in the same fashion as the two additional inputs of the sourcing drive circuit. Accordingly, the output of the aforementioned voltage source is fed to a first one of said two additional inputs of the sinking drive circuit, for controlling the bias voltage of the sinking FET 189, and in turn controlling the quiescent current of the OPS. The second one of said two additional inputs of the sinking drive circuit is fed from the voltage provided at the emitter terminal of the NPN-transistor 163.

The sourcing drive circuit and the sinking drive circuit can be viewed as comprising current mirrors whose DC operating point is programmable by means of applying voltages at the bias voltage control inputs. A voltage applied at the second terminal of the resistor 155 and to the second terminal of the resistor 151 typically controls a substantially static biasing, while a voltage applied to the second terminal of the resistor 161 and to the second terminal of the resistor 162 controls a dynamic biasing. A differential mode voltage applied across the bias voltage control inputs gives rise to a respective bias voltage applied between the gate and source terminals of the sourcing and sinking active output devices 185,189. The bias voltages are substantially equal.

Currents through the sourcing FET 185 and the sinking FET 189 are determined by sensing a respective voltage across the current sense resistors 200,176. The base terminals of the NPN-transistors 202,209 are inputs for measuring the voltage across the current sense resistor 200, via the resistor 201. The NPN-transistors 202,209 are members of a second long-tailed pair of a second differential amplifier for amplifying the voltage across the current sense resistor 200, and converting it to a sourcing sense current $I_{C1}$ being sourced to the resistor 224. Said long-tailed pair further encompasses the constant current generator 207. In the embodiment shown, a good approximation of the constant current generator 207 is a resistor.

Conversely, the base terminals of the PNP-transistors 213, 220 are inputs for measuring the voltage across the current sense resistor 176, via the resistor 212. The PNP-transistors 213,220 are members of a third long-tailed pair of a third differential amplifier for amplifying the voltage across the current sense resistor 176, and sinking a sinking sense current $I_{C2}$ from the resistor 224. Said long-tailed pair further encompasses the constant current generator 218. In the embodiment shown, a good approximation of the constant current generator 218 is a resistor.

A voltage across the resistor 224 is sensed and a proportional voltage being referenced to the positive terminal of the first supplementary voltage supply 124 is applied at the base terminal of the NPN-transistor 163. The NPN-transistor 163 operates as an emitter-follower. Hence, a voltage proportional to the voltage across the resistor 224 is present between the emitter terminal of the NPN-transistor 163 and the positive terminal of the first supplementary voltage supply 124.

Accordingly, an increase of the aforesaid programmable but substantially static control voltage for controlling the bias voltages results in an increase of gate voltages $V_{GS}$ of the active output devices, and consequently an increase of the quiescent current, and vice versa.

Furthermore, an increase of the voltage between the positive terminal of the first supplementary voltage supply 124 and the emitter terminal of the NPN-transistor 163 results in decreased gate voltages of the active output devices, and vice versa.

The static control voltage is adjustable by means of the potentiometer 159. By a slightly different opting, e.g. by slightly increasing the impedance of the current sense resistors 200,176, or by introducing temperature compensation by means of e.g. a thermistor, not shown, a potential need for trimming of individual amplifiers during production is obviated. Thus, the potentiometer 159 either is, or can be made obsolete and replaced by a fixed resistor network.

Neither of the current sense resistors 200,176 are arranged to passively control a respective voltage $V_{GS}$ applied between the gate terminal and the source terminal of the sourcing FET 185 and the sinking FET 189 by means of local feedback.

It is to be particularly observed that although the current sense resistor 176 is connected to the source terminal of the sinking FET 189, it is not a degeneration resistor, since it is indeed excluded from forming a local feedback loop. A voltage drop across the current sense resistor 176 does not directly yield a reduction of the voltage $V_{GS}$ applied between the gate terminal and the source terminal of the sinking FET 189. Rather, the voltage $V_{GS}$ depends on the voltage across the resistor 174 which in turn depends on the current supplied from the transistor 156 and so forth.

Figure 4:
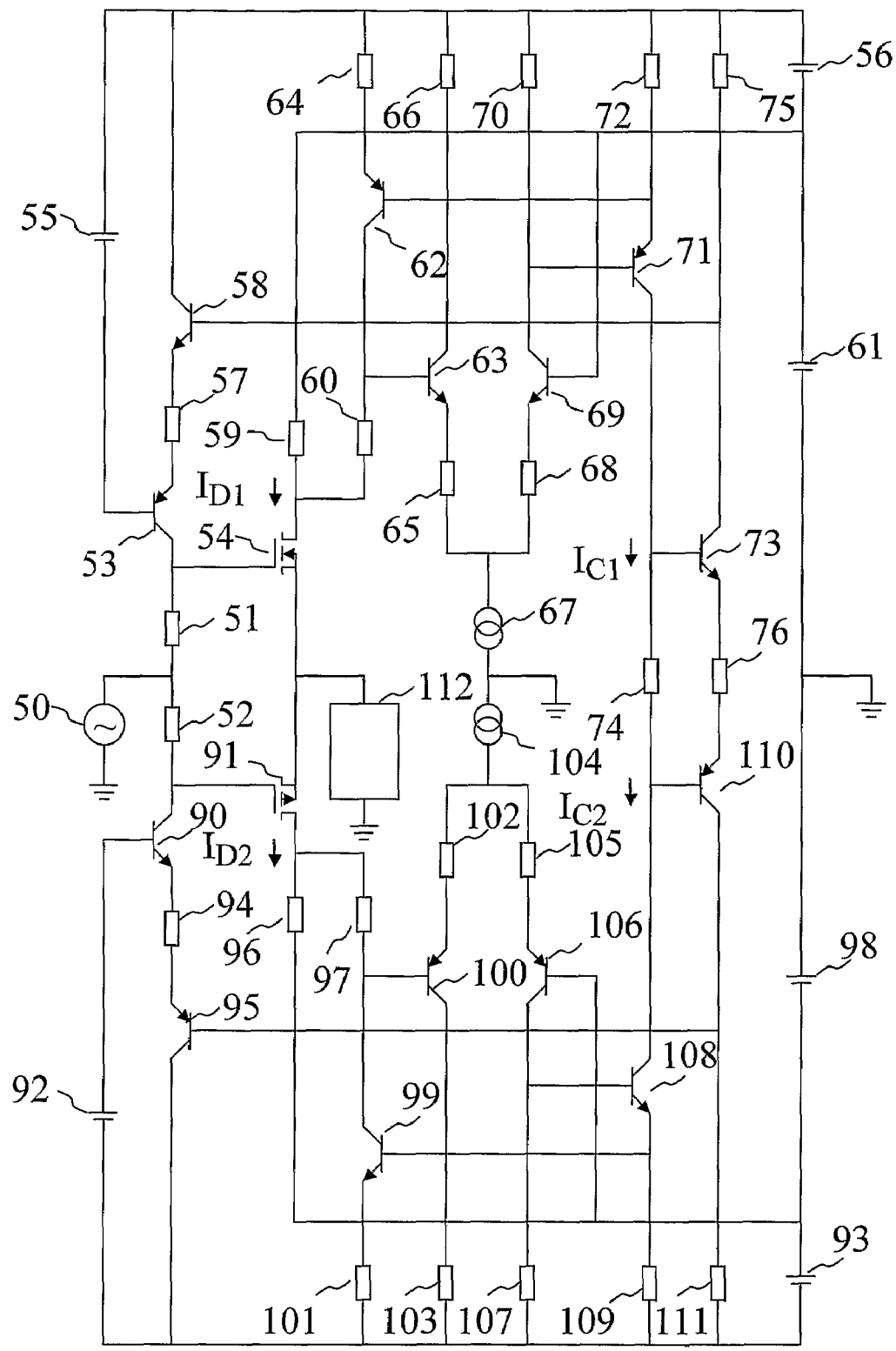
FIG. 4 is an electrical circuit diagram showing substantially the amplifier of FIG. 3 in more detail.

A circuit containing the transistor 203, the resistor 204 and the resistor 201, and a circuit containing the transistor 214, the resistor 215 and the resistor 212 provide feedback in the same manner as in the embodiment of FIG. 4, for reducing effects of process and thermal variations, and thus for providing highly accurate currents $I_{C1}$ and $I_{C2}$.

The amplifier furthermore employs global, overall negative voltage feedback. A feedback network comprising the resistor 138 and the resistor 131 is arranged between the output of the amplifier and the negative input of the aforementioned first long-tailed pair, at the base terminal of the NPN-transistor 128.

Compensation capacitors, not shown, may be added to increase stability of the amplifier, e.g. a miller-type capacitance in the input stage of the amplifier in order to accomplish a dominant pole. Compensation is well known in the art.

It should be appreciated that the OPS current-sense resistors may be placed differently than shown, both for CC and CE topologies and quasi-complementary designs, without departing from the scope and the spirit of the invention. The important aspect of the invention with respect to placement of current sense resistors is that a voltage across a current sense resistor placed in a sourcing or sinking current path of an OPS, for sensing a current through the sourcing circuitry and sinking circuitry respectively does not passively and directly affect a control signal applied at the input of a corresponding active output device.

This is typically accomplished by relating an OPS control voltage applied to a gate terminal, base terminal or equivalent of an active output device directly to the shared terminal of the active output device, i.e. to the source terminal, emitter terminal or equivalent.

Figure 6:
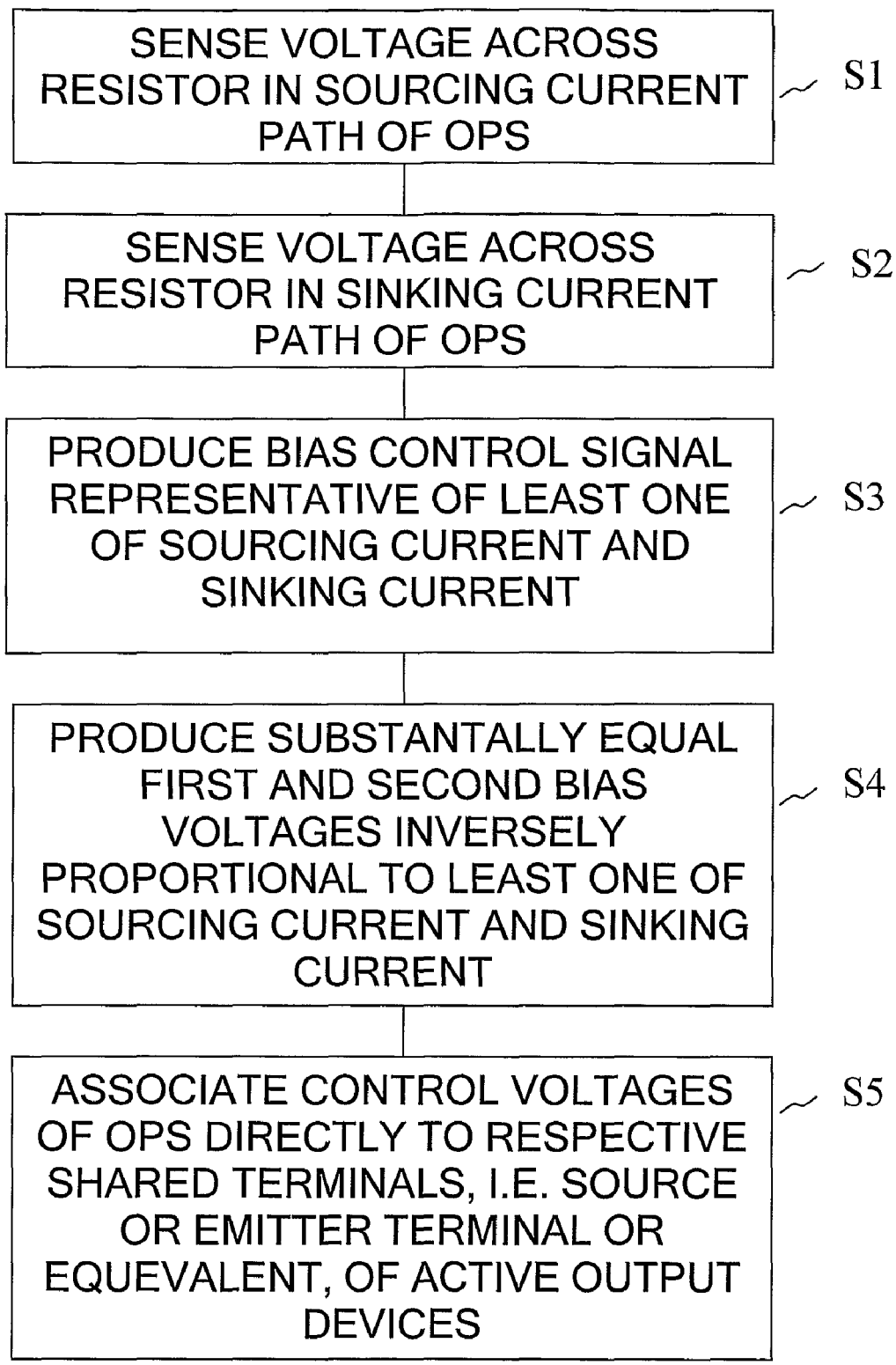
FIG. 6 is a flowchart showing a biasing method according to the invention.

The invention will now be explained further with reference to the flow chart depicted in FIG. 6.

A sourcing current in an OPS of a push-pull amplifier is sensed by sensing a first voltage across a sourcing sense resistor located in a sourcing current path of the OPS, S1.

Furthermore, a sinking current in the OPS is sensed by sensing a second voltage across a sinking sense resistor located in a sinking current path of the OPS, S2.

In response to the sensed first and second voltages that represent the sourcing current and the sinking current respectively, a current is produced, which current represents the least one of the sourcing current and the sinking current, S3.

The current is drawn through a resistor, for producing a bias control voltage proportional thereto. The bias control voltage is sensed and in response thereto, a first and a second bias voltage are established which control the quiescent current of the amplifier. The first and second bias voltages are inversely proportional to the bias control voltage, for providing negative feedback, S4.

An output stage sourcing-signal is referenced directly to a shared terminal of a corresponding sourcing active output device, and an output stage sinking-signal is referenced directly to a shared terminal of a corresponding sinking active output device, S5.

The invention is applicable to a broad range of classes, topologies and modes of operation not explicitly explained herein. Any necessary alterations of the invention would be obvious to one skilled in the art. The invention is for example applicable to output power stages having cascoded or paralleled active output devices. The active output devices are typically FETs, e.g. vertical Power MOSFETs (DMOSFETs), or BJTs but may also be e.g. valves or IGBTs.

The invention claimed is:

1. An electronic push-pull amplifier having an output stage, which output stage further has at least one sourcing active output device for sourcing a sourcing current to a load through a sourcing current path, and at least one sinking active output device for sinking a sinking current from the load through a sinking current path, comprising
   a sourcing current sense resistor for facilitating sensing of the sourcing current through the output stage sourcing current path of the push-pull amplifier, the sourcing current sense resistor being located in the output stage sourcing current path,
   a sinking current sense resistor for facilitating sensing of the sinking current through the output stage sinking current path of the push-pull amplifier, the sinking current sense resistor being located in the output stage sinking current path,
   a quiescent current control means for controlling a quiescent current through the output stage sourcing current path and sinking current path in response to the least one of the sourcing current and the sinking current through the output stage sourcing current path and sinking current path, respectively,
   whereby output impedance and crossover distortion are reduced.

2. An electronic push-pull amplifier according to claim 1 further comprising
   a sourcing drive circuit for producing an output stage sourcing signal directly referenced to a shared terminal of the sourcing active output device and
   a sinking drive circuit for producing an output stage sinking signal directly referenced to a shared terminal of the sinking active output device.

3. An electronic push-pull amplifier according to claim 2 wherein the sourcing drive circuit produces a voltage that is applied directly between a gate terminal and a source terminal of the sourcing active output device, and wherein the sinking drive circuit produces a voltage that is applied directly between a gate terminal and a source terminal of the sinking active output device.

4. A method of reducing output impedance and crossover distortion in an electronic push-pull amplifier having an output stage, which output stage further has at least one sourcing active output device for sourcing a sourcing current through a sourcing current path, and at least one sinking active output device for sinking a sinking current through a sinking current path, comprising the steps of:
   sensing the sourcing current through the sourcing current path of the output stage, by sensing a first voltage across a sourcing sense resistor arranged in the sourcing current path of the output stage,
   sensing the sinking current through the sinking current path of the output stage, by sensing a second voltage across a sinking sense resistor arranged in the sinking current path of the output stage,
   producing in response to the sourcing current and the sinking current a bias control signal representative of the least one of the sourcing current and the sinking current, said bias control signal being proportional to the least one of the sourcing current and the sinking current,
   controlling a sourcing bias voltage and a sinking bias voltage in response to the bias control signal,
   referencing a sourcing output stage control signal applied at a gate or base terminal of the sourcing active output device directly to a shared terminal of the sourcing active output device, and
   referencing a sinking output stage control signal applied at a gate or base terminal of the sinking active output device directly to a shared terminal of the sinking active output device.

5. The method of claim 4 further comprising the steps of creating a first bias control signal in response to a voltage across the sourcing sense resistor, thus representing a current through the sourcing active output device, and creating a second bias control signal in response to a voltage across the sinking sense resistor, thus representing a current through the sinking active output device.

6. The method of claim 5 further comprising the steps of sourcing and sinking a current through a resistor, said current representing the least one of the output stage sourcing current and the output stage sinking current, sensing a voltage across said resistor for producing a biasing control voltage, and producing symmetric bias voltages inversely proportional to said biasing control voltage.

* * * * *